United States Patent [19]

Schmitz et al.

[11] Patent Number: 4,680,074

[45] Date of Patent: Jul. 14, 1987

[54] METHOD FOR PRODUCING A CARRIER MATERIAL FOR THE SOLAR CELLS OF A SOLAR GENERATOR

[75] Inventors: Walter Schmitz, Wedel; Jürgen Koch, Holm, both of Fed. Rep. of Germany

[73] Assignee: Licentia Patent-Verwaltungs-GmbH, Frankfurt am Main, Fed. Rep. of Germany

[21] Appl. No.: 732,813

[22] Filed: May 10, 1985

[30] Foreign Application Priority Data

May 16, 1984 [DE] Fed. Rep. of Germany ....... 3418078

[51] Int. Cl.$^4$ ............................................. H01L 31/02
[52] U.S. Cl. .................................. 156/291; 136/244; 156/299; 427/74
[58] Field of Search ......................... 136/245, 251, 244; 156/296, 291, 297, 299, 302; 427/74; 428/198, 261; 29/572

[56] References Cited

U.S. PATENT DOCUMENTS

| | | | |
|---|---|---|---|
| 3,255,047 | 6/1966 | Escoffery | 136/244 |
| 4,401,710 | 8/1983 | Bansemir et al. | 136/245 |
| 4,419,531 | 12/1983 | Lang et al. | 136/245 |

Primary Examiner—Michael Ball
Attorney, Agent, or Firm—Spencer & Frank

[57] ABSTRACT

A method for producing a carrier material for use in a solar generator composed of a plurality of solar cells electrically conductively connected together and fastened to the carrier material. The method includes providing a glass fiber fabric composed of intersecting glass fibers; applying liquid plastic composed of a plastic dissolved in a solvent to the points of intersection of the glass fibers; evaporating the solvent; and hardening the plastic so that the glass fibers are firmly mechanically connected together by the hardened plastic at the points of intersection.

18 Claims, 2 Drawing Figures

METHOD FOR PRODUCING A CARRIER MATERIAL FOR THE SOLAR CELLS OF A SOLAR GENERATOR

BACKGROUND OF THE INVENTION

The present invention relates to a method for producing a carrier material for use in a solar generator, wherein the solar generator is composed of a plurality of solar cells electrically conductively connected together and fastened to the carrier material.

Carrier materials for accommodating the solar cells of a solar generator, particularly a flexible solar generator for space travel, are known in the form of pure plastic sheets, and reinforced glass fiber or reinforced carbon fiber sheets. These sheets have the drawback that they are either too heavy, too opaque or not stiff enough. When used in solar generators for space travel they exhibit the additional drawbacks that they absorb the infrared (IR) radiation from the sun and/or the earth and thus undesirably contribute to an increase in operating temperature.

SUMMARY OF THE INVENTION

It is therefore an object of the present invention to provide a method for the manufacture of a solar cell carrier material which simultaneously has low weight, high light permeability and the greatest possible stiffness.

The above and other objects are accomplished in accordance with the invention by the provision of a solar cell carrier material which is manufactured by a method including:

providing a glass fiber fabric composed of intersecting glass fibers;

applying liquid plastic composed of a plastic dissolved in a solvent to the points of intersection of the glass fibers;

evaporating the solvent; and hardening the plastic so that the glass fibers are firmly mechanically connected together by the hardened plastic at the points of intersection.

The significant advantage of the present invention is seen to be the avoidance of the above-mentioned drawbacks which occur with use of the prior art sheets used for solar cell carrier material.

DESCRIPTION OF THE PREFERRED EMBODIMENTS

Figure 1:
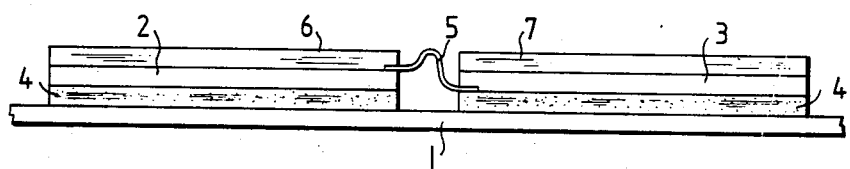
FIG. 1 of the drawings is a sectional view of a flexible solar generator with reference to which the method according to the invention will be described.

Referring to FIG. 1, two solar cells 2 and 3 are glued to a carrier material 1, composed of glass fiber fabric, via an adhesive layer 4 which is preferably composed of transparent silicone rubber. Normally, the adhesive is applied to the carrier material 1 or to the undersides of solar cells 2 and 3, respectively, through screen-printing masks. Solar cells 2 and 3 are electrically conductively connected together by means of a connector 5 and their upper faces are covered by glass covers 6 and 7, respectively. Instead of being fastened to the back of the solar cells as illustrated, the glass fiber fabric carrier 1 can be fastened to the front active sides of the solar cells so as to replace the glass covers 6 and 7 and to simultaneously act as a carrier material (substrate). A transparent silicone adhesive may be used as the fastening means.

According to the invention the carrier material 1 is a glass fiber fabric, preferably provided with a pattern of openings realized by defined pitches between warp or weft filaments. A liquid plastic, for example polyester, polyimides and polycarbonates, is applied to the points of intersection of the glass fibers. After evaporation of the solvent contained in the liquid plastic and/or polymerization or otherwise hardening of the liquid plastic by a heat treatment the glass fibers are firmly mechanically bonded to one another at the points of intersection. The glass fiber fabric can then additionally be reinforced if necessary at given locations by means of plastics. This may be done by means of plastic sheets which are liquid when dissolved in solvents and which do not become solid again until after the solvent has evaporated and/or they have hardened. Examples for such plastics are also polyester, polyimides and polycarbonates.

The liquid plastic is applied to the glass fiber fabric provided with the opening pattern so as to partially or completely saturate the glass fiber fabric with the liquid plastic, or the liquid plastic is applied to the points of intersection or the locations in the glass fiber fabric to be reinforced, by means of a brush, a roller or a mask, or by screen-printing.

Figure 2:
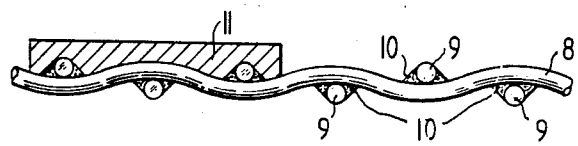
FIG. 2 is a sectional view of a glass fiber fabric manufactured according to the method of the invention.

FIG. 2 shows part of a glass fiber fabric, which includes a warp fiber 8, six weft fibers 9 and the plastic 10 which connects the fibers at their points of intersection according to the invention. The additional reinforcement 11 is also shown in FIG. 2.

A solar generator equipped with such a glass fiber fabric is distinguished by low absorption of IR radiation. The IR radiation passes through the solar generator without producing a noticeable increase in temperature. The result is a lower operating temperature and thus an increase in performance.

Preferably, a solar generator constructed according to the invention will utilize solar cells having rear contacts in the form of a grid finger system similar to that of their front sides rather than a planar silver contact. This is necessary for ultra-thin solar cells, inter alia, to minimize the high curvature of the solar cells which would otherwise be caused by a rear contact of planar silver.

The increase in performance resulting from low operating temperatures of a solar generator constructed according to the invention is of interest primarily for geostationary satellite paths which have an orbital radius of 36,000 km. For low earth orbits (300–1000 km), the performance of the solar generator may be further increased by using rear-active solar cells which additionally convert the radiation emanating from the earth (earth albedo) into electrical energy.

One glass fiber which can be used is Interglass 90240. It is understood that other fibers of plastic or inorganic origin can be used.

It will be understood that the above description of the present invention is susceptible to various modifications, changes and adaptations, and the same are intended to be comprehended within the meaning and range of equivalents of the appended claims.

What is claimed is:

1. A method for producing a carrier material for use in a solar generator composed of a plurality of solar cells electrically conductively connected together, the solar cells being fastened only on one side thereof to the carrier material, said method comprising:

provida glass fiber fabric composed of intersecting glass fibers;

applying liquid plastic composed of a plastic dissolved in a solvent to only the points of intersection of the glass fibers;

evaporating the solvent; and hardening the plastic so that the glass fibers are firmly mechanically connected together by the hardened plastic at the points of intersection.

2. Method as defined in claim 1, wherein said applying step includes brushing the liquid plastic onto the points of intersection of the glass fiber fabric.

3. Method as defined in claim 1, wherein said applying step includes applying the liquid plastic to the points of intersection of the glass fiber fabric by means of a roller.

4. Method as defined in claim 1, wherein said applying step includes applying the liquid plastic to the points of intersection of the glass fiber fabric by means of screen printing.

5. Method as defined in claim 1, wherein said applying step includes applying the liquid plastic to the points of intersection of the glass fiber fabric with the aid of a mask.

6. Method as defined in claim 1, further including reinforcing the glass fiber plastic with plastic at selected locations.

7. Method as defined in claim 6, wherein said reinforcing step includes using plastic which is liquid when dissolved in a solvent or under the influence of heat and which becomes solid after evaporation of the solvent and subsequent hardening, or after cooling, respectively.

8. Method as defined in claim 7, wherein said reinforcing step includes brushing the liquid plastic onto the locations of the glass fiber fabric to be reinforced.

9. Method as defined in claim 7, wherein said reinforcing step includes applying the liquid plastic to the locations of the glass fiber fabric to be reinforced by means of a roller.

10. Method as defined in claim 7, wherein said reinforcing step includes applying the liquid plastic to the locations of the glass fiber fabric to be reinforced by means of screen printing.

11. Method as defined in claim 7, wherein said reinforcing step includes applying the liquid plastic to the locations of the glass fiber fabric to be reinforced with the aid of a mask.

12. Method of manufacturing a solar generator composed of solar cells each having a front active side, comprising:

providing a carrier material according to the steps of claim 1; and fastening the carrier material to the front-active sides of the solar cell to simultaneously serve as a cover for the solar cells and as a carrier material for mounting the solar cells.

13. Method as defined in claim 12, wherein said fastening step includes using a transparent silicone adhesive for fastening the carrier material to the solar cells.

14. Method as defined in claim 1, wherein said hardening step includes a heat treatment.

15. Method for manufacturing a solar generator comprising:

providing a glass fiber fabric composed of intersecting glass fibers;

applying liquid plastic, composed of a plastic dissolved in a solvent, only to the points of intersection of the glass fibers;

evaporating the solvent;

hardening the plastic so that the glass fibers are firmly mechanically connected together by the plastic at the points of intersection; and fastening at least one solar cell only on one side thereof to the glass fiber fabric and hardened plastic, the glass fiber fabric and hardened plastic serving as a substrate for the at least one solar cell.

16. Method as defined in claim 15, including fastening a plurality of solar cells to the glass fiber fabric and hardened plastic; and electrically conductively interconnecting the solar cells.

17. Method as defined in claim 15, wherein the solar cell has an active side remote from the substrate and further including fastening a glass cover to the active-side of the solar cell.

18. Method as defined in claim 15, wherein the solar cell has an active side and said fastening step includes fastening the substrate to the active side of the solar cell.

* * * * *